Oct. 13, 1970 W. R. REMLEY ET AL 3,534,272

FILTER SYSTEM

Original Filed April 9, 1965 4 Sheets-Sheet 1

INVENTOR
WINSLOW R. REMLEY

BY Maurice H. Klitzman
ATTORNEY

United States Patent Office 3,534,272 Patented Oct. 13, 1970

3,534,272

FILTER SYSTEM

Winslow R. Remley, Bethesda, Md., assignor to International Business Machines Corporation, Armonk, N.Y., a corporation of New York Continuation of application Ser. No. 446,840, Apr. 9, 1965. This application Dec. 3, 1969, Ser. No. 876,175
Int. Cl. G01r 23/16
U.S. Cl. 328—167 6 Claims

ABSTRACT OF THE DISCLOSURE

A simple filter system for achieving complicated adjustable transfer functions comprising a mixing means for mixing the signal to be filtered with a control signal which determines the transfer function of the filter system, a circulating loop for shifting the frequencies being circulated within the circulating loop, and a bandpass filter for extracting the desired output frequency band from the frequency circulating within the circulating loop.

This application is a continuation of U.S. patent application Ser. No. 446,840 filed Apr. 9, 1965, now abandoned.

This invention relates to electrical filter systems having adjustable frequency transfer functions. More particularly, this invention relates to a filter having a frequency transfer function which is adjustable in response to a periodic control signal.

In the prior art, a filter circuit having a desired frequency transfer function could usually be constructed from a plurality of parallel and/or serial resonant circuits having various resonant frequencies and bandwidths. This approach is generally satisfactory when the desired frequency transfer function is relatively simple. However, if the desired frequency transfer function is relatively complex, complicated arrangements of large numbers of resonant circuits may be required. Furthermore, if it is desired to change the frequency transfer function of such a filter, it is necessary to adjust the values of the physical components of the various resonant circuits. Hence, such filter circuits are unsuitable for complicated filters, and for many adaptive processing and voice communication systems wherein continuously varying frequency transfer functions are required.

It is therefore an object of this invention to provide a simple filter system for achieving complicated frequency transfer functions.

It is also an object of this invention to provide a filter system having a readily adjustable frequency transfer function.

In accordance with the above objects I provide a filter system having a frequency transfer function which is controlled by a periodic control signal rather than by the adjustment of the physical components of the system. More particularly, the shape of one period of the control signal in the time domain determines the shape of the filter transfer function in the frequency domain. In the preferred embodiment, my filter system includes a multiplier for multiplying the periodic control signal with the signal to be filtered, a summing device for injecting the output from the multiplier into a signal circulating loop, delay means for delaying the signal circulating in the loop, means for shifting the frequency of the signal circulating in the loop by an amount equal to the reciprocal of the loop delay, and a band pass filter for extracting an output signal from the signal circulating loop.

An advantage of this invention is in providing a simple filter system having a frequency transfer function which depends upon a periodic control signal rather than on the characteristics of the complicated arrangements of resonant circuits used in the prior art filter systems.

Other objects and advantages of my invention will be pointed out in the following description and claims and illustrated in the accompanying drawings, which disclose, by way of example, the principle of the invention and the best mode which has been contemplated of applying that principle.

STRUCTURE

Figure 1:
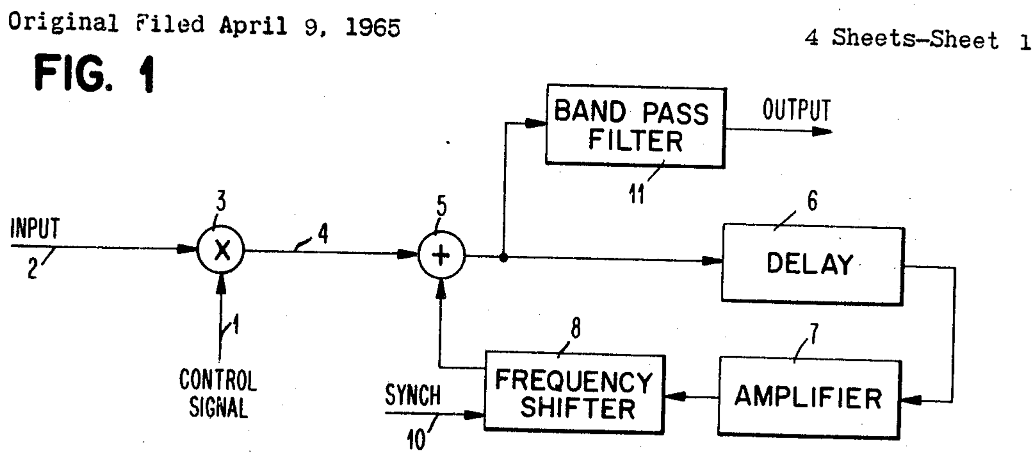
FIG. 1 is a block diagram of the preferred form of the subject filter system.

A block diagram of the preferred form of my filter system is shown in FIG. 1. Input signals are provided to the system on lines 1 and 2. Line 1 carries the periodic control signal which controls the frequency transfer function of the filter system. For each patricular application of the filter system, the periodic control signal will be chosen so that one period of the control signal as a function of time corresponds to the real part of the transfer characteristic of the filter system as a function of frequency.

The periodic control signal may be generated by any convenient means. Such means are not within the contemplation of this invention. However, in the preferred form of my invention, the control signal is subject to certain restrictions. First, the control signal must be periodic with period T. Second, the highest frequency component of the control signal must be less than $k/T$ where $k$ is an integer constant. The reasons for these restrictions will be explained below in conjunction with the analysis of the operation of the invention.

It should be noted that for the purposes of the present invention the meaning of the word "periodic" is not limited to its strict mathematical definition. Since nothing in nature is rigorously periodic in the mathematical sense, the "periodic" signals discussed herein are intended to include signals which are nearly periodic. Hence, the principles of my invention are deemed to encompass the use of signals which are slowly varying from period to period as long as successive periods are highly similar.

Line 2 carries the signal to be filtered. In the preferred form of my invention, the signal to be filtered should be band limited to the frequency band from $k/T$ to $(k+1)/T$. The reasons for this requirement will likewise be explained in conjunction with the analysis of the operation of the system, but it should be noted that, for most applications, the period T of the control signal should be made as short as possible in order that input signals of relatively wide band widths may be processed.

The signal to be filtered is multiplied with the periodic control signal in multiplier 3. Multiplier 3 may be simply a mixer or product modulator of the type well known in the art. For example, multiplier 3 may be of the type described in "Electronic Computing Circuits," S. Sealy, McGraw Hill Book Co., New York, 1958, page 266 et seq.

The output from multiplier 3 is a broad band signal comprising the sum and difference frequencies of the frequency components of the control signal and the signal to be filtered. It is noted that because the highest frequency component of the control signal is less than $k/T$ and because the lowest frequency component of the signal to be filtered is greater than $k/T$ the lowest difference frequency will be greater than zero. This result is important in order to avoid the loss of information in subsequent processing.

The output from multiplier 3 is fed into summing circuit 5. Summing circuit 5 serves to add the output signal from multiplier 3 to the signal circulating in the loop comprising delay means 6, amplifier 7, and frequency shifter 8. The output signal from the summing circuit is recirculated through the loop. Summing circuit 5 may be of a type well known in the art. For example, summing circuit 5 may be of the type described in "Electronic Computing Circuits," supra, page 251, et seq.

In the preferred form of my filter system, delay means 6 serves to adjust the total delay of the signal circulating loop to time T which is equal to the period of the control signal. This function may be accomplished by a variety of delay means, for example, magnetic drums, magnetic tape, electronic or ultrasonic delay lines, and the like. The article "Ultrasonic Delay Line," by D. L. Arenberg, 1954 Convention Record of the Institute of Radio Engineers, describes delay lines suitable for performing the function of delay means 6.

Amplifier 7 serves to maintain the total gain of the signal circulating loop close to unity. Amplifier 7 is simply a broad band amplifier of the type well known in the art.

In accordance with the principles of my invention, means are provided for shifting the frequency of the circulating signals by an amount equal to the reciprocal of the loop delay. In the preferred form of my invention, frequency shifter 8 operates to increase the frequency of the signals circulating in the loop by $1/T$ which is equal to the fundamental frequency of the control signal. One type of frequency shifter which might be employed comprises a heterodyning circuit in combination with an oscillator of frequency $1/T$. Such heterodyning circuits are described in chapter 10 of "Radio Engineering," by Frederick Terman, McGraw Hill Book Co., 3rd edition, but it should be apparent to those skilled in the art that other means for performing this function might be employed. It should be noted further that linear phase modulators are generally equivalent to frequency shifters. Hence, the principles of my invention are deemed to encompass the use of both types of devices.

In the preferred form of my filter system, frequency shifter 8 receives synchronizing signals on line 10 which serve to maintain a stable phase relationship between the control signal on line 1 and the output of frequency shifter 8. The particular phase relationship between the control signal and the output of frequency shifter 8 will be determined by the desired system output for each application of my filter system.

The system output is obtained from the signal circulating loop by means of band pass filter 11. In the preferred form of my invention, the transfer function of band pass filter 11 is equal to unity over the frequency band from $k/T$ to $(k+1)T$ where $k$ and T are the quantities previously defined. It should be recognized, however, that the principles of my invention may be practiced using a band pass filter which does not strictly adhere to these requirements. For example, band pass filter 11 may have a transfer function greater or less than unity. The deviation from unity would merely introduce a scaling factor into the output. However, the transfer function of band pass filter 11 should be uniform over the entire pass band in order to avoid distortion of the output signal. Furthermore, the principles of my invention may be practiced using a band pass filter which passes energy only in a narrower frequency band within the band from $k/T$ to $(k+1)/T$. In fact, the use of the narrower frequency band will be desirable in many applications. However, in order to avoid a distorted output, the frequency band in which band pass filter 11 passes energy should not extend beyond the frequency band from $k/T$ to $(k+1)/T$.

Figure 2:
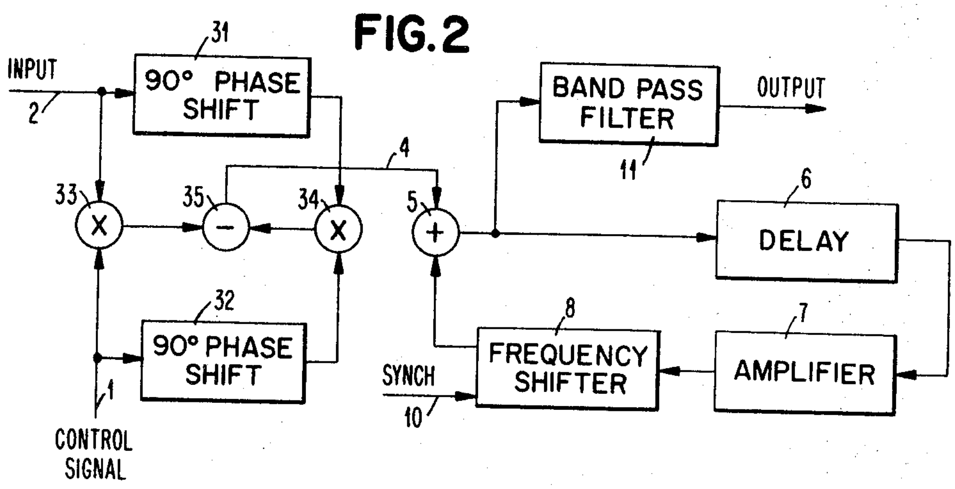
FIG. 2 is a block diagram of a modified embodiment of the subject filter system.

A block diagram of a modified form of my filter system is shown in FIG. 2. In this modified form of my filter system the combination of phase shift networks 31 and 32, multipliers 33 and 34, and difference network 35 has been substituted for multiplier 3 of the filter system shown in FIG. 1. The combination of phase shift networks 31 and 32, multipliers 33 and 34, and difference network 35 will be recognized as a Hartley single side band modulator of the type described in "Electronic Computing Circuits," supra, page 555 et seq. Whereas only the difference frequencies in the output from multiplier 3 contribute to the final output signal of the filter system shown in FIG. 1, the difference frequencies are absent, and only the sum frequencies present in the output 4 of the Hartley single side band modulator shown in FIG. 2. In order to form a system output using the sum frequencies, frequency shifter 8 must be arranged to decrease the frequency of the signals circulating in the loop by $1/T$ rather than increase them as in the system shown in FIG. 1.

In some applications the phase $\Psi$ of the frequency transfer function $G(f)$ of the system will be important, $$\Psi=\tan^{-1}\frac{\text{Imaginary Part } G(f)}{\text{Real Part } G(f)}$$

Figure 3:
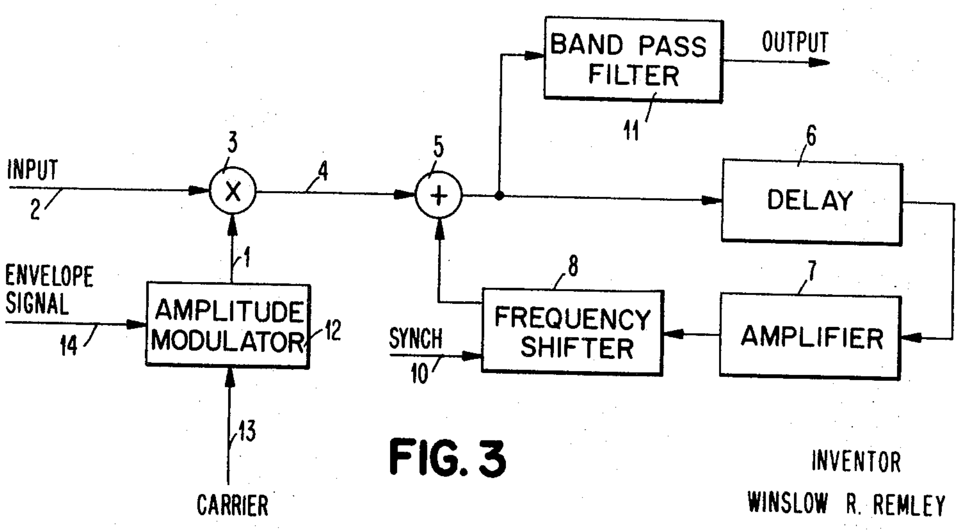
FIG. 3 is a block diagram of an embodiment of the subject filter system for use in situations where only the power transfer function, and not its phase, is of importance.

In other applications only the power transfer function $P(f)$ of the system will be important, $$P(f)=[\text{Real Part } G(f)]^2+[\text{Imaginary Part } G(f)]^2$$

and the phase of the transfer function may be ignored. In applications of the latter variety, it may be desirable to use a special type of periodic control signal. FIG. 3 shows a block diagram of a filter system including means for generating such a control signal. More particularly, FIG. 3 shows the filter system of FIG. 1 with the addition of amplitude modulator 12. Amplitude modulator 12 receives a carrier signal on line 13, and an envelope signal periodic with period T on line 14. The envelope signal is given by:

$$E(t)=\sqrt{P(t/T^2)}$$

the carrier signal is given by:

$$\cos 2\pi nt/T$$

where $n$ is an integer chosen so that $n/T$ is larger than the highest frequency component of $E(t)$ and so that the sum of $n/T$ and the highest frequency component of $E(t)$ is less than $k/T$. These limitations on the choice of $n$ are necessary to insure that all of the frequency components in the output from the amplitude modulator 12 falls within the frequency band from 0 to $k/T$. The output 1 from amplitude modulator 12 is therefore given by:

$$E(t)\cos 2\pi nt/T$$

which serves as the control signal to control the power transfer function of the filter system.

Although each of the foregoing embodiments of my filter system includes a signal circulating loop comprising summing circuit 5, delay means 6, amplifier 7, and frequency shifter 8; it should be understood that the practice of the principles of my invention is not limited to these elements. The functions which these elements perform are: delaying successive portions of the product signal, shifting the frequency of the successive portions of the product signal by amounts proportional to the delay experienced by those portions, and combining the portions so delayed and frequency-shifted. It will be apparent to those skilled in the art that there are other means for performing these functions. For example, the functions of the signal circulating loop might be performed by a long delay line having a number of taps along its length, a frequency shifting device on each tap, and a summing circuit for combining the outputs from the frequency shifting devices. The practice of my invention is deemed to encompass such apparatus and other equivalent means for performing the functions of the signal circulating loop.

Whereas the preceding paragraphs have set forth the preferred form and two modifications of my filter system, the following paragraphs will present an example of the operation of the preferred form of my invention, and will develop, by way of such example, an analysis of the principles of operations of my invention.

OPERATION

Returning to the filter system shown in FIG. 1, if the following four conditions are met:

(1) The control signal, $u(t)$, is periodic with period T, i.e., $u(t)=u(t+nT)$ where $n$ is an integer;

(2) The highest frequency component in the control signal, $u(t)$, is less than $k/T$, where $k$ is an integer constant;

(3) The signal to be filtered, $v(t)$, is band limited to the frequency band from $k/T$ to $(k+1)/T$;

(4) Band pass filter 11 has unity transfer in the frequency band from $k/T$ to $(k+1)/T$ and zero transfer outside this band; then the Fourier transform of the system output, $o(t)$, is related to the Fourier transform of the signal to be filtered, $v(t)$, by the equation:

$$F\{o(t)\}=\tfrac{1}{2}F\{v(t)\}[u(fT^2)-j\hat{u}(fT^2)]$$

where F{} denotes the Fourier Transform operation and where $u(fT^2)=u(t)$ evaluated at $t=fT^2$, and $\hat{u}(fT^2)$=the Hilbert transform of $u(t)$ evaluated at $t=fT^2$ where the Hilbert transform of $u(t)$ is simply $u(t)$ advanced by a 90° phase shift.

From the above equation it follows that the frequency transfer function, $G(f)$, of the filter system is given by:

$$G(f)=\frac{F\{o(t)\}}{F\{v(t)\}}=\tfrac{1}{2}[u(fT^2)-j\hat{u}(fT^2)]$$

The generality of this result may be demonstrated by conventional mathematical techniques, however, it is somewhat simpler to demonstrate the principles of operation of my filter systems by way of an example using specific input and control signals.

Figure 4:
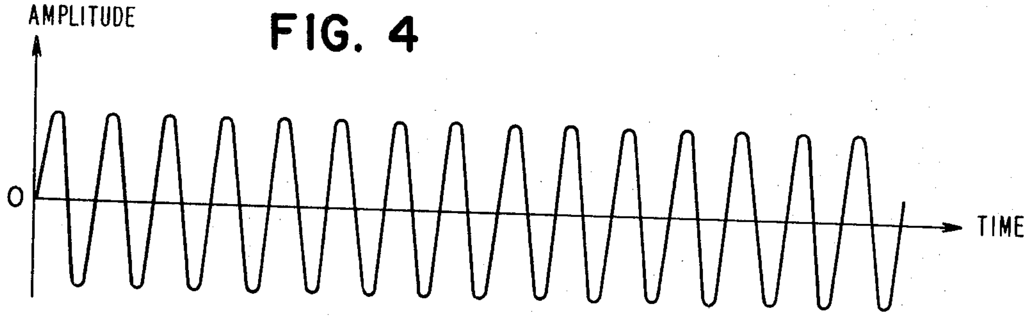
FIG. 4 is an example of a signal to be filtered shown as a function of time.
Figure 5:
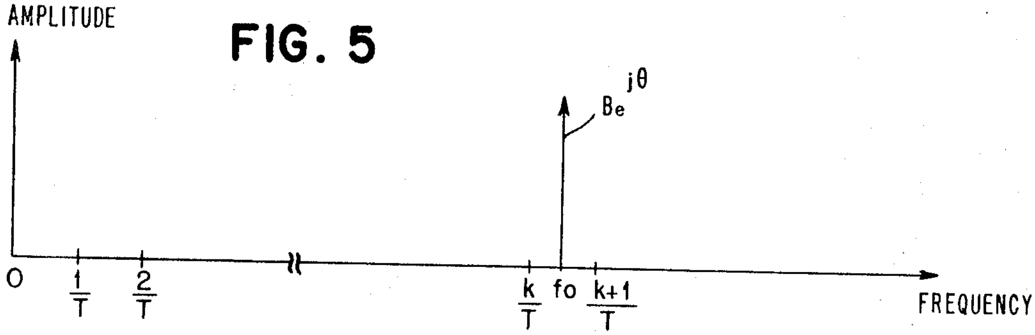
FIG. 5 is the frequency diagram of the signal shown in FIG. 4.

For instance, let the input signal to be filtered, $v(t)$, be given by:

$$v(t)=B\cos(2\pi f_0t+\theta)=\text{Real Part of } Be^{2\pi jf_0t+j\theta}$$

where B equals the amplitude of the signal to be filtered, $f_0$ equals the frequency of the signal to be filtered which is between $k/T$ and $(k+1)/T$, and $\theta$ equals the phase of the signal to be filtered. FIG. 4 shown this input signal as a function of time. FIG. 5 shows the same input signal as a function of frequency.

Figure 6:
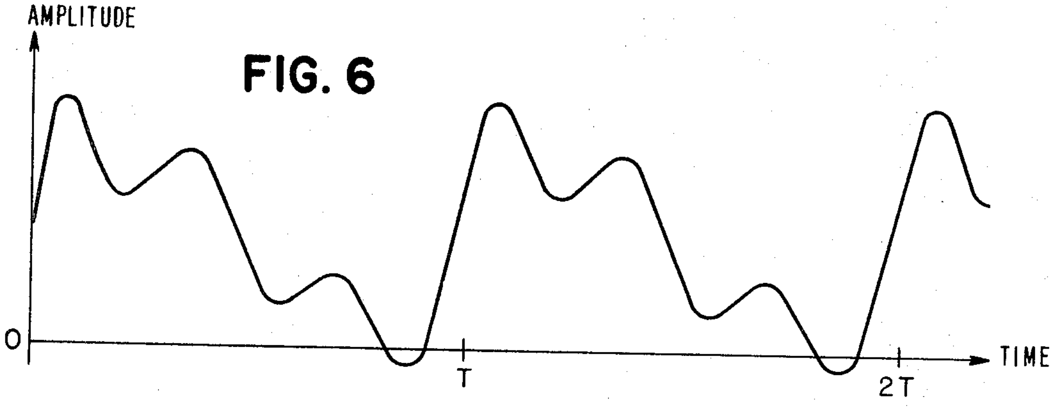
FIG. 6 is an example of a periodic control signal shown as a function of time.

Because the control signal, $u(t)$, has period T, it can be expressed as a Fourier series with fundamental frequency $1/T$. In other words, the control signal, $u(t)$, can be expressed as:

$$u(t)=\sum_{n=1}^{k}A_n\cos\left(\frac{2\pi nt}{T}+\phi_n\right)+\frac{A_0}{2}$$

where $A_n$=the amplitude of the $n$th harmonic of the fundamental frequency, $\phi_n$ equals the phase of the $n$th harmonic, and $A_0/2$ equals the DC level of $u(t)$. FIG. 6 shows an example of a typical control signal as a function of time where:

$$A_0=3/2$$
$$A_1=1$$
$$A_2=1/2$$
$$A_3=3/4$$
$$A_4=1/4$$
$$A_5\ldots A_n=0$$

and $$\phi_1,\phi_2\ldots\phi_n=0$$

Figure 7:
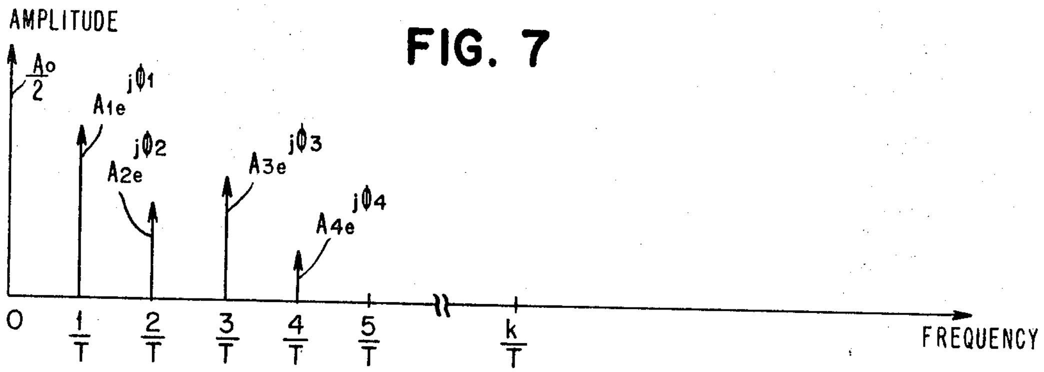
FIG. 7 is a frequency diagram of the periodic control signal shown in FIG. 6.

FIG. 7 shows a frequency diagram of the same control signal.

Using the well known simple trigonometric relation, $$\cos x\cos y=\tfrac{1}{2}[\cos(x+y)+\cos(x-y)]$$

it is easy to prove that the product $v(t)u(t)$ is given by:

$$v(t)u(t)=\frac{BA_0}{2}\cos(2\pi f_0t+\theta)+\frac{B}{2}\sum_{n=1}^{N}A_n\cos\left(2\pi f_0t+\theta+\frac{2\pi nt}{T}+\phi_n\right)-\frac{B}{2}\sum_{n=1}^{N}A_n\cos\left(2\pi f_0t+\theta-\frac{2\pi nt}{T}-\phi_n\right)$$

FIG. 8*a* shows a frequency diagram of this product signal as it appears at the input to delay means 6.

Figure 8:
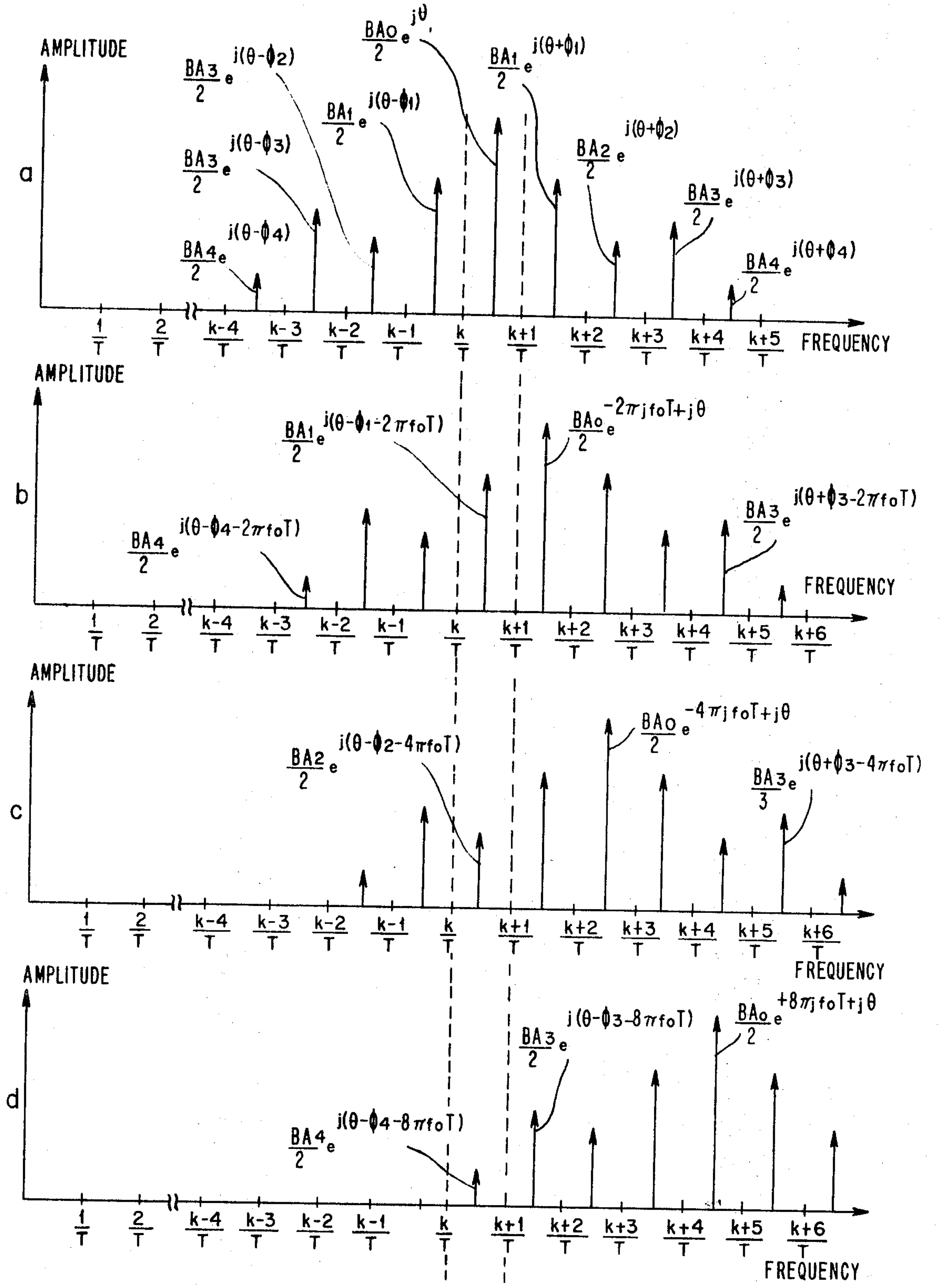
FIG. 8 is a set of frequency diagrams of the signals circulating in the loop after 0, 1, 2, and 4 circulations.

During each circulation around the loop, delay means 6 retards the phase of each component of the product signal by an amount equal to $2\pi f_0T$, and frequency shifter 8 increase the frequency of each component by an amount equal to $1/T$, which is equivalent to advancing the phase of each component by an amount equal to $2\pi t/T$. FIG. 8*b* shows a frequency diagram of the product signal after one circulation around the loop. FIG. 8*c* shows a frequency diagram of the product signal after two circulations. FIG. 8*d* shows a frequency diagram of the product signal after four circulations around the loop. Taking FIG. 8 as a whole it may be seen that, as a result of each circulation around the loop, the entire product signal is shifted toward the high end of the frequency spectrum by an amount equal to $1/T$ while the phase of each component of the product signal is delayed by $2\pi f_0T$.

It will be remembered that a condition of operation of my filter system is that band pass filter 11 passes energy only in the frequency band from $k/T$ to $(k+1)/T$. This frequency band is indicated by the dotted lines shown in FIG. 8. FIG. 8 also shows that, by action of frequency shifter 8, successive difference frequency components of the product signal are shifted into this frequency band during each circulation of the signals around the loop. It is noted that, for the specific example under consideration, energy contributions from all of the difference frequency components of the product signal will be present in the frequency band from $K/T$ to $(k+1)/T$ at each instant of time after four circulations around the loop. Hence, after four circulations, this frequency band will contain all of the information in the product signal. The interaction of all of the signal energy contributions within the frequency band from $k/T$ to $(k+1)/T$ produces the system output, $o(t)$, the frequency spectrum of which is given by:

$$\left[\frac{BA_0}{2}e^{j\theta}+\frac{BA_1}{2}e^{j(\theta-\phi_1-2\pi f_0T)}+\frac{BA_2}{2}e^{j(\theta-\phi_2-4\pi f_0T)}+\frac{BA_3}{2}e^{j(\theta-\phi_3-6\pi f_0T)}+\ldots\right]\delta(f-f_0)$$

$$=\frac{B_e{}^{j\theta}}{2}\delta(f-f_0)\sum_{n=0}^{k}A_ne^{j\phi_n-jn2\pi f_0T}$$

where $\delta(f-f_0)$ is the Dirac delta function which serves to position the spectral line at frequency $f_0$. Since the spectrum of the signal to be filtered was $B_e{}^{j\theta}\delta(f-f_0)$ and because the spectrum of the system output divided by the spectrum of the signal to be filtered denotes the system transfer function, the system transfer function at arbitrary frequency $f$ in the band from $k/T$ to $(k+1)/T$ is given by:

$$A_0/2+\tfrac{1}{2}\sum_{n=1}^{k}A_n[\cos(2\pi nfT+\phi_n)-j\sin(2\pi nfT+\phi_n)]$$

since the sine leads the cosine function by 90°, and since $2\pi nfT=2\pi nt/T$ when $t=fT^2$, we may obtain by substitution:

$$G(f)=\tfrac{1}{2}[u(fT^2)-j\hat{u}(fT^2)]+A_0/4$$

which is the transfer function of my filter system.

Figure 9:
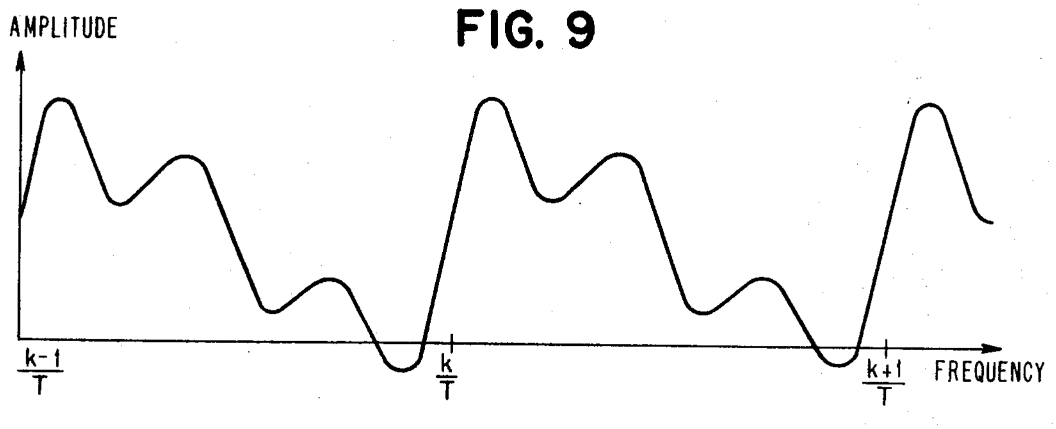
FIG. 9 shows the real part of the frequency transfer function of the subject filter system in response to the control signal shown in FIG. 6.
Figure 10:
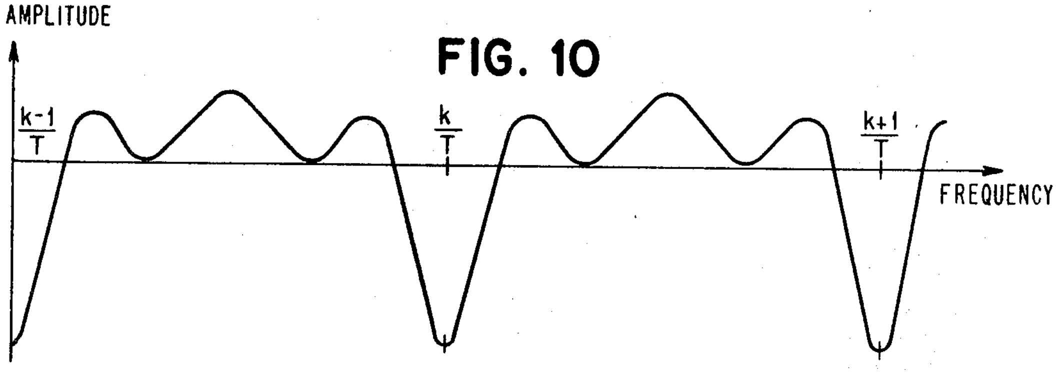
FIG. 10 shows the imaginary part of the frequency transfer function of the subject filter system in response to the control signal shown in FIG. 6.
Figure 11:
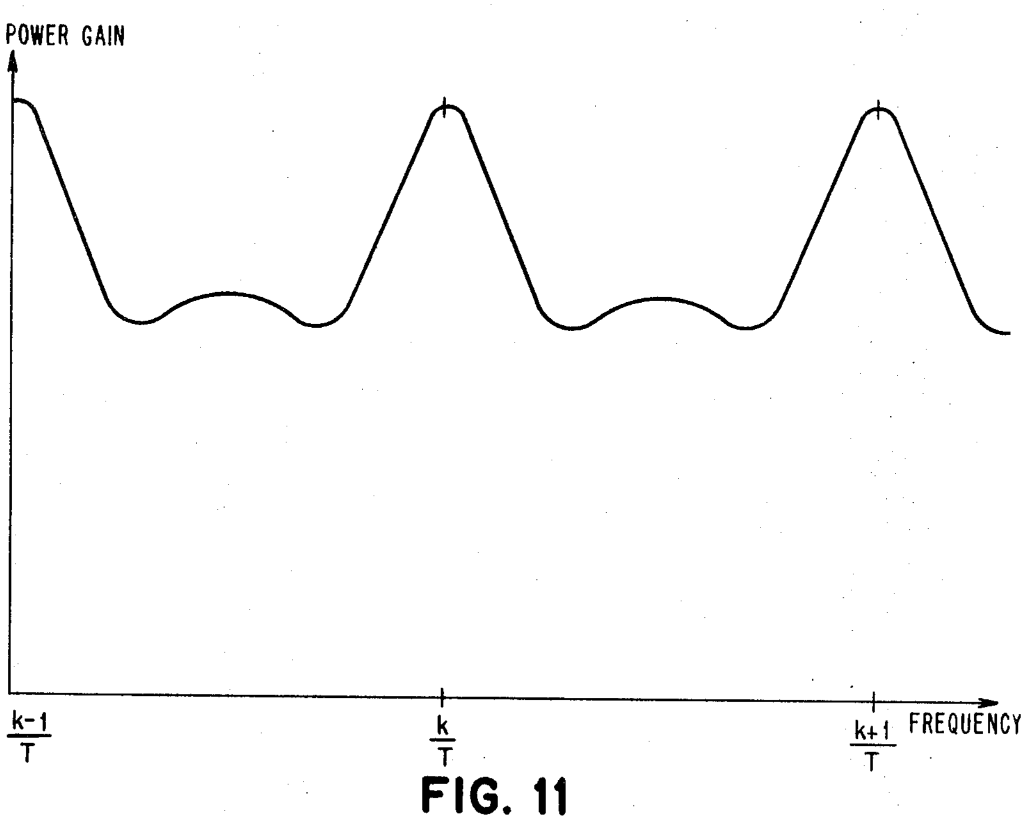
FIG. 11 shows the power transfer function of the subject filter system in response to the control signal shown in FIG. 6.

FIG. 9 illustrates the real part, $u(f\mathrm{T}^2)$, of the frequency transfer function $\mathrm{G}(f)$ of my filter system in response to the control signal shown in FIG. 6. It is noted that the shape of the real part of the frequency transfer function corresponds to the shape of the control signal, but the former is a function of frequency whereas the latter is a function of time. The imaginary part, $\hat{u}(f\mathrm{T}^2)$, of the transfer function, $\mathrm{G}(f)$, is shown in FIG. 10. The power transfer function for $A_0$ equal zero is given by:

$$P(fT^2)=\tfrac{1}{4}|u(fT^2)-j\hat{u}(fT^2)|^2=\frac{u^2(fT^2)}{4}+\frac{\hat{u}^2(fT^2)}{4}$$

which is simply one fourth of the intantaneous envelope squared of the control signal, $u(t)$. FIG. 11 illustrates the power transfer function of my filter system in response to the control signal shown in FIG. 6.

The precise positioning of the filter transfer function in the frequency spectrum is determined by the phase relation between the control signal and the frequency shift introduced by frequency shifter 8 shown in FIG. 1. More precisely, the value of the transfer function at $f=k/T$ is equal to $\tfrac{1}{2}[u(t)-j\hat{u}(t)]$ evaluated at the instant that the phase shift introduced by the frequency shifter is an integral multiple of $2\pi$. In other words, if the frequency shift introduced by frequency shifter 8 should lag the control signal, the transfer functions shown in FIGS. 9, 10, and 11 would be translated to the left, toward the low end of the frequency spectrum.

At this point it might be useful to review some of the reasons for the general restrictions on the input signals:

(1) The control signal, $u(t)$, must be periodic in order to permit an orderly interaction among the signals circulating in the loop.

(2) The highest frequency component in $u(t)$ must be less than $k/T$ so that the lowest difference frequency component in the product signal $v(t)u(t)$ will be greater than zero.

(3) The signal to be filtered must be band limited to a frequency band of width $1/T$ in order to prevent adjacent portions of the frequency spectrum of the product signal from interfering with each other. For example, with reference to FIG. 8a, if the input signal $v(t)$ exceeds bandwidth $1/T$, the portions of the product signal from $(k-1)/T$ to $k/T$ and from $(k+1)$ to $(k+2)/T$ would spread over into the band from $k/T$ to $(k+1)/T$ causing error in the output. This error would be compounded as the signals circulate around the loop.

(4) The band pass filter 11 should have unity transfer in the frequency band from $k/T$ to $(k+1)/T$ in order to avoid a distorted output. Referring again to FIG. 8, if the frequency band of band pass filter 11 extends beyond the band from $k/T$ to $(k+1)/T$, the system output will contain spurious contributions from the bands $(k-1)/T$ to $k/T$ and $(k+1)/T$ to $(k+2)/T$. However, if the frequency band of band pass filter 11 is narrower than $k/T$ to $(k+1)/T$, the system output will merely comprise a subsection of the transfer functions shown in FIGS. 9, 10, and 11.

Although the foregoing analysis and proof of the principles of operation of my invention has been developed by way of particular example of operation using a specific control signal and a specific signal to be filtered, it will be recognized by those skilled in the art that the principles of operation may be easily extended to the general case encompassing any control signal and any signal to be filtered within the general restrictions set forth above.

It should be apparent that my filter system is susceptible of a wide variety of applications. In fact, my filter system may be used in any applications in which conventional filters have been used. However, it will be especially attractive to use my filter system in applications which require very complicated transfer functions or time varying transfer functions. For instance, it would be attractive to use my filter system in matched filter detection schemes of the type described in "Introduction to Matched Filters" by G. L. Turin, IRE Transactions on Information Theory, June 1960, Vol. 1T–6, No. 3, p. 311. Since complicated transfer functions are involved it is considered obvious to use my filter system in matched filter detection schemes.

It would also be attractive to use my filter system as a continuously variable delay line. Since the prior art delay lines are simply physical filters, and since the physical elements of the prior art delay lines must be adjusted in order to vary the delay time, it is considered obvious to substitute my filter system for such physical prior art devices. With my filter system only the control signal need be adjusted in order to vary the delay time.

While the invention has been particularly shown and described with reference to a particular embodiment thereof, it will be understood by those skilled in the art that the foregoing and other changes in form and details may be made therein without departing from the scope of the invention.

What I claim is:

1. A filter system having a frequency transfer characteristic which is controlled by a periodic control signal, comprising:

- means for multiplying the periodic control signal with the signal to be filtered so as to form a product signal, the periodic control signal having period T and the periodic control signal consisting of frequency components that are harmonics of the frequency defined by said period T where the highest frequency component of the periodic control signal is less than $k/T$ when $k$ is a constant, the signal to be filtered being band limited to the frequency band from $k/T$ to $(k+1)/T$;
- a signal circulating loop having loop delay T, said loop consisting of,
  - means for adding the product signal to the signal circulating in said loop, and
  - means for shifting the frequency of the signal circulating in said loop by an amount equal to $1/T$;
- a bandpass filter outside of said signal circulating loop for extracting an output signal from said circulating loop, said bandpass filter passing only signals within the frequency band from $k/T$ to $(k+1)/T$.

2. A filter system having a frequency transfer function which is controlled by a periodic control signal, comprising:
 multiplying means for multiplying the periodic control signal with the signal to be filtered so as to form a product signal, the periodic control signal having period T and the periodic control signal consisting of frequency components that are harmonics of the frequency defined by said period T where the highest frequency component of the periodic control signal is less than $k/T$ where $k$ is a constant, the signal to be filtered being band limited to the frequency band from $k/T$ to $(k+1)/T$;
 a signal circulating loop, said loop consisting of,
  a summing circuit for adding said product signal to the signal circulating in said loop,
  a delay line for adjusting the total loop delay to time T,
  an amplifier for adjusting the total loop gain to unity, and
  a heterodyning circuit for increasing the frequency of the signal circulating in said loop by an amount equal to $1/T$;
 means for synchronizing said heterodyning circuit with said periodic control signal;
 a bandpass filter outside of said signal circulating loop for extracting an output signal from said loop, said bandpass filter having unity transfer and only the frequency band from $k/T$ to $(k+1)/T$.

3. A filter system having a frequency transfer function which is controlled by a period control signal, comprising:
 an amplitude modulator for modulating a carrier signal with an envelope signal so as to form a periodic control signal having period T;
 said envelope signal E(t) having period T such that $$E(t)=\sqrt{P(f)}=\sqrt{P(t/T^2)}$$

where $P(f)$ is the desired power transfer function of the filter system evaluated at $f=t/T^2$ in the frequency $k/T\leqslant f\leqslant(k+1)/T$; and
 said carrier signal having frequency $n/T$ such that $n/T$ is higher than the highest frequency component of $E(t)$, where $n$ is an integer, and such that the sum of $n/T$ and the highest frequency component of $E(t)$ is less than $k/T$;
 multiplying means for multiplying the periodic control signal with the signal to be filtered so as to form a product signal, the periodic control signal having period T and the periodic control signal consisting of frequency components that are harmonics of the frequency defined by said period T where the highest frequency component of the periodic control signal is less than $k/T$ where $k$ is a constant, the signal to be filtered being band limited to the frequency band from $k/T$ to $(k+1)/T$;
 a signal circulating loop, said loop including,
  a summing circuit for adding said product signal to the signal circulating in said loop,
  a delay line for adjusting the total loop delay to time T,
  an amplifier for adjusting the total loop gain to unity, and
  a heterodyning circuit for increasing the frequency of the signal circulating in said loop by an amount equal to $1/T$;
 means for synchronizing said heterodyning circuit with said periodic control signal;
 a bandpass filter outside of said signal circulating loop for extracting an output signal from said loop, said bandpass filter having unity transfer in the frequency band from $k/T$ to $(k+1)/T$.

4. A filter system having a frequency transfer function which is controlled by a periodic control signal, comprising:
 multiplying means for multiplying the periodic control signal with the signal to be filtered so as to form a product signal, the periodic control signal having period T and the periodic control signal consisting of frequency components that are harmonics of the frequency defined by said period T where the highest frequency component of the periodic control signal is less than $k/T$ where $k$ is a constant, the signal to be filtered being band limited to the frequency band from $k/T$ to $(k+1)/T$;
 means for eliminating the difference frequency components from said product signal;
 a signal circulating loop, said loop comprising;
  a summing circuit for adding said product signal to the signal circulating in said loop,
  a delay line for adjusting the total loop delay to time T,
  an amplifier for adjusting the total loop gain to unity, and
  a heterodyning circuit for decreasing the frequency of the signal circulating in said loop by an amount equal to $1/T$;
 means for synchronizing said heterodyning circuit with said periodic control signal;
 a bandpass filter outside of said signal circulating loop for extracting an output signal from said loop, said bandpass filter having unity transfer and transferring only the frequency band from $k/T$ to $(k+1)/T$.

5. A filter system having a frequency transfer characteristic which is controlled by a periodic control signal, comprising:
 a periodic control signal source for generating a periodic control signal having a period T and consisting of selected frequency components that are only harmonics of the frequency defined by said period T and the highest allowable frequency component in said periodic control signal is less than $k/T$ where $k$ is a constant;
 an input signal to be filtered, said input signal being band limited to the frequency band $k/T$ to $(k+1)/T$;
 multiplying means for multiplying said input signal by said periodic control signal to produce a product signal, said product signal having a band width greater than $1/T$;
 a circulating loop having loop delay T and total loop gain of unity for continuously adding said product signal to the circulating signal in said circulating loop and for shifting the frequency of the resulting summation by an amount equal to $1/T$;
 means for extracting from said circulating loop only those frequencies within the band $k/T$ to $(k+1)/T$ whereby an output signal is obtained that is equal to the input signal modified by a transfer function as represented by said periodic control signal.

6. A method of filtering an input signal that is band limited to a frequency band of $k/T$ to $(k+1)/T$ comprising the steps of:
 generating a control signal, said control signal being periodic in T and having a plurality of frequency components where each is a harmonic of a fundamental frequency as defined by $1/T$, the highest allowable frequency component in said control signal being equal to $(k-1)/T$;
 multiplying said input signal by said control signal to form a product signal, said product signal containing a plurality of frequency sets, the number of said frequency sets being equal to the number of frequency components in said input signal and each frequency set comprising a plurality of product frequency components, said plurality of product frequency components being the sums and differences of the base frequency component associated with a given frequency set and, each of said control signal frequency component, the amplitude and phase of each product frequency component in each said frequency set being dictated by the amplitudes and phases of the control frequency component and the base frequency component used to generate that product frequency component;

generating an output frequency component from each frequency set by shifting all the sum product frequency components or all the different product frequency components to the base frequency of the frequency component associated with that frequency set and vectorally adding all said shifted product frequency components to form said output frequency component;

summing together said output frequency components for all said frequency sets to obtain an output signal which has a bandwidth equal to the input signal and modified by a transfer function as controlled by said control signal.

References Cited

UNITED STATES PATENTS 2,997,650 8/1961 Appelbaum ---------- 324—77

DONALD D. FORRER, Primary Examiner

H. A. DIXON, Assistant Examiner

U.S. Cl. X.R.

324—77

UNITED STATES PATENT OFFICE
CERTIFICATE OF CORRECTION

Patent No. 3,534,272 Dated October 13, 1970

Inventor(s) Winslow R. Remley

It is certified that error appears in the above-identified patent and that said Letters Patent are hereby corrected as shown below:

Column 6, line 71, the formula "K/T" should read --k/T--.

Column 7, line 75, the equation "(k+1)" should read --(k+1)/T--

Signed and sealed this 2nd day of May 1972.

(SEAL)
Attest:

EDWARD M.FLETCHER,JR.
Attesting Officer

ROBERT GOTTSCHALK
Commissioner of Patents